United States Patent [19]

Takeda

[11] 4,264,864

[45] Apr. 28, 1981

[54] PROGRAMMABLE BINARY COUNTER

[75] Inventor: Ichiro Takeda, Tokorozawa, Japan

[73] Assignee: Toko, Inc., Japan

[21] Appl. No.: 20,775

[22] Filed: Mar. 15, 1979

[30] Foreign Application Priority Data

Apr. 7, 1978 [JP] Japan ................................ 53/41000

[51] Int. Cl.³ ...................... H03K 21/34; H03K 21/36
[52] U.S. Cl. ........................................ 328/48; 328/42; 328/49
[58] Field of Search .............................. 328/48, 49, 42

[56] References Cited

U.S. PATENT DOCUMENTS 3,096,483 7/1963 Ransom .................................. 328/48
3,395,352 7/1968 McCammon ...................... 328/48 X
3,745,315 7/1973 Brendzel ............................. 328/48 X Primary Examiner—John S. Heyman
Attorney, Agent, or Firm—Jay M. Cantor

[57] ABSTRACT

A plurality of flip-flops in cascade are divided into first and second groups. A first gate detects all of the first group assuming a logic 1 to set an RS flip-flop which in turn presets the first group. A second gate changes its logic output when the second groups takes a predetermined logic state after the detection by the first gate. A D type flip-flop, upon simultaneously receiving both an input pulse and the changed output of the second gate, produces an output which presets the second group and resets the RS flip-flop.

7 Claims, 3 Drawing Figures

FIG. 3

| DECIMAL DIGIT \ FLIP-FLOP | 1 | 2 | 3 | 4 | 5 | 6 | ---- | N-1 | N |
|---|---|---|---|---|---|---|---|---|---|
| X   | 1 | 1 | 1 | 1 | 1 | 1 | ---- | 1 | 1 |
| X-1 | 0 | 1 | 1 | 1 | 1 | 1 | ---- | 1 | 1 |
| X-2 | 1 | 0 | 1 | 1 | 1 | 1 | ---- | 1 | 1 |
| ⋮ | ⋮ | ⋮ | ⋮ | ⋮ | ⋮ | ⋮ | ⋮ | ⋮ | ⋮ |
| 17 | 1 | 0 | 0 | 0 | 1 | 0 | ---- | 0 | 0 |
| 16 | 0 | 0 | 0 | 0 | 1 | 0 | ---- | 0 | 0 |
| 15 | 1 | 1 | 1 | 1 | 0 | 0 | ---- | 0 | 0 |
| 14 | 0 | 1 | 1 | 1 | 0 | 0 | ---- | 0 | 0 |
| 13 | 1 | 0 | 1 | 1 | 0 | 0 | ---- | 0 | 0 |
| ⋮ | ⋮ | ⋮ | ⋮ | ⋮ | ⋮ | ⋮ | ⋮ | ⋮ | ⋮ |
| 4 | 0 | 0 | 1 | 0 | 0 | 0 | ---- | 0 | 0 |
| 3 | 1 | 1 | 0 | 0 | 0 | 0 | ---- | 0 | 0 |
| 2 | 0 | 1 | 0 | 0 | 0 | 0 | ---- | 0 | 0 |
| 1 | 1 | 0 | 0 | 0 | 0 | 0 | ---- | 0 | 0 |
| 0 | 0 | 0 | 0 | 0 | 0 | 0 | ---- | 0 | 0 |

PROGRAMMABLE BINARY COUNTER

FIELD OF THE INVENTION

This invention relates generally to a binary counter, and particularly to a programmable, asynchronous binary down counter reliably responsive to an input signal of high repetition frequency and suitable for being compactly manufactured on an integrated circuit chip.

BACKGROUND OF THE INVENTION

Since the binary counter is one of the most useful of logical circuits, there are many kinds of binary counters. As is well known, the fundamental purpose of the binary counter is to record the number of occurrences of some input.

In an asynchronous binary counter comprising an array of flip-flops, an input signal is frequency divided while advancing down the counter. As a consequence, the flip-flops indicating upper bits may be of slow response type as against those indicating the lower bits. This is advantageous where the counter is constructed of MOS FETs (Metal-oxide semiconductor Field-effect transistors) in that a MOS FET flip-flop of slow response type can be manufactured in smaller size on a silicon chip without adversely affecting its response reliability. Hence such a counter can be reduced in size and this is markedly advantageous where the counter includes a large number of flip-flops.

However, if the counter is programmable and includes a large number of flip-flops to be preset by a pulse with a narrow width, the above advantage can not be realized. This is because even the flip-flops indicating the upper bits should be so fabricated as to reliably respond to such a narrow preset pulse. This case would arise if one of high frequency input pulses is used as a preset pulse.

Therefore, in order to overcome this difficulty, there has been proposed an improvement as shown in FIG. 2 of the accompanying drawings.

Prior to a description of this invention, the conventional programmable, asynchronous binary down counter of FIG. 1 will be discussed with reference to FIG. 3.

As shown in FIG. 1, a plurality of T type flip-flops 2(1)–2(N) are coupled in cascade. Before counting starts, the desired number of the flip-flops are preset to logic 1 while the remaining are preset to logic 0, by applying appropriate preset signals to them through a preset terminal 5 and data input terminals 6(1)–6(N), respectively. These terminals 5 and 6(1)–6(N) are coupled to suitable gates, although not shown. It is here assumed for convenience that all the flip-flops 2(1)–2(N) are preset to logic 1. At this time, the initial logic states of the counter are as shown in the second line of FIG. 3 (i.e., 111111 . . . 11 (binary code)=x (decimal digit)). When a first input pulse is applied to the counter through an input terminal 8, the flip-flop 2(1) goes to logic 0 in response to the input pulse. The other flip-flops 2(2)–2(N) are not affected by this change, thus, the logic states of all the flip-flops are as shown in the third line of FIG. 3 (i.e., 011111 . . . 11). The occurrence of the second input pulse causes the flip-flop 2(1) to go from logic 0 to 1, and substantially at the same time causing the flip-flop 2(2) to go from logic 1 to 0. Therefore, the logic states of the counter becomes as shown in the fourth line of FIG. 3 (i.e., 101111 . . . 11). Thus, the counter counts down from the preset binary digit, and when reaching 111100 . . . 00 (decimal 15), each of the flip-flops 2(5)–2(N) assumes a logic 0. Hence, an OR gate 10 changes its output level from logic 1 to 0. At this time, however, all input lines of a NOR gate 14 are not at logic 0's so that the gate 14 remains at logic 0. Thereafter, when the counter counts down to 010000 . . . 00 (decimal 2), the NOR gate 14 assumes a logic 1 in that (1) an inverter 12 is interposed between the flip-flop 2(2) and the gate 14, and (2) the gate 10 remains at the logic 0 at this time. As a result, a D type flip-flop 16 assumes a logic 1 in response to a logic 1 of the input signal applied through the terminal 8. The logic 1 state of the D type flip-flop 16 causes all the flip-flops 2(1)–2(N) to be preset to the initial logic states for the next counting cycle, through a preset line 4. The output of the counter is derived from an output terminal 17 if desired every counting cycle. Alternatively, if the output of the counter is needed every input cycle, the logic states of all the flip-flops should be derived by providing each flip-flop with an additional output.

It is understood that the pulse width of the preset signal is about two times that of the input pulse applied to the T input. Resultantly, according to this prior art, some flip-flops indicating upper bits can be somewhat reduced in size as opposed to the case where the flip-flop 16 is not provided.

However, if the counter of FIG. 1 includes a large number of flip-flops and should count in response to a high frequency input signal, then the width of the preset pulse is insufficient for reliable presetting, thereby making it impossible to reduce the counter size. More specifically, assuming that the number of the flip-flops is 10 and the repetition frequency of the input is 8 MHz (a pulse width 250 ns), the tenth or rightmost flip-flop receives a toggling pulse with a width of 16 $\mu$s from its preceding flip-flop. Whilst, the tenth flip-flop receives a preset pulse width of 500 ns. Therefore, the tenth flip-flop must be manufactured so as to reliably respond to the preset pulse (500 ns) not to the toggling pulse (16 $\mu$s). This also applies to the other flip-flops indicating upper bits.

It is therefore a primary object of this invention to provide a programmable, asynchronous binary down counter having a small size while maintaining a reliable response to a high frequency input.

Another object of this invention is to provide a miniaturized programmable, asynchronous binary down counter constructed on a silicon chip by using MOS technology without adversely affecting the reliability of response to a high frequency input.

Still another object of this invention is to provide a programmable, asynchronous binary down counter including a plurality of flip-flops which are divided into two groups for effectively presetting.

SUMMARY OF THE INVENTION

According to this invention, a programmable binary down counter comprising: an input terminal supplied with input pulses to be counted; a plurality of presettable flip-flops coupled in cascade and divided into first and second groups; first means for detecting all the flip-flops of said first group in logic 0; second means for presetting all the flip-flops of said first group in response to said detection by said first means; third means for detecting the detection by said first means as well as a predetermined logic state of said second group, said predetermined logic state corresponding to a decimal digit 2; and fourth means for presetting all the flip-flops of said second group and resetting said second means, in response to said detection by said third means and to the input pulse.

BRIEF DESCRIPTION OF THE DRAWINGS

These and other objects, features and many of the attendant advantages of this invention will be appreciated more readily as the same becomes better understood by reference to the following detailed description, when considered in connection with the accompanying drawings, wherein like parts in each of the several figures are identified by the same reference characters, and wherein:

FIG. 3 is a Table showing decimal digits and corresponding binary codes for illustrating this invention.

DETAILED DESCRIPTION OF THIS INVENTION

Figure 1:
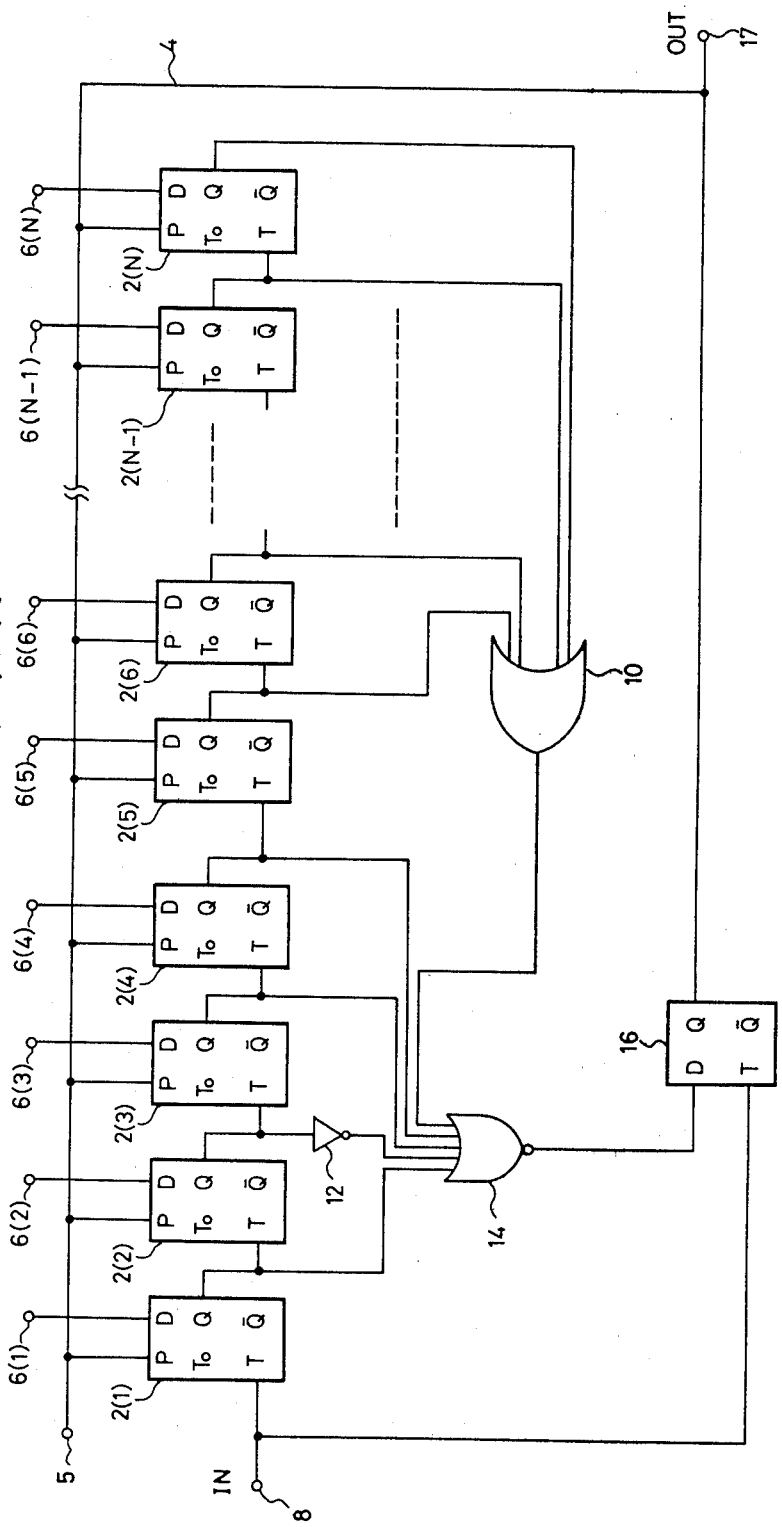
FIG. 1 is a circuit diagram showing a conventional programmable, asynchronous binary down counter.

A preferred embodiment of this invention will be discussed with reference to FIGS. 2 and 3, but the functions which are identical to the prior art of FIG. 1 will be briefly discussed or otherwise be omitted for clarity. Like the case of FIG. 1, it is assumed that before counting starts, all the flip-flops 2(1)–2(N) are preset to logic 1's so that the logic states thereof are 111111 ... 11 as shown in FIG. 3. The flip-flops 2(1)–2(4) are preset through the preset terminals 5 and 6(1)–6(4), while the flip-flops 2(5)–2(N) are preset through a preset terminal (not shown) and terminals 6(5)–6(N). Then, the counter counts down with each occurrence of the input pulses. When the counter reaches the logic state of 111100 ... 00 (decimal 15), each of the first group of flip-flops assumes a logic 0. Hence, a NOR gate 18 changes its output from logic 0 to 1, causing an RS flip-flop 20 to be set. The logic 1 state of the RS flip-flop 20 presets the first group of flip-flops 2(5)–2(N). Thereafter, when the counter counts down to 2 (decimal), viz., 010000 ... 00 (binary), the NOR gate 14 assumes a logic 1 in that it receives a logic 0 level from an inverter 22. A D type flip-flop 16 is supplied with the logic 1 level from the gate 14, assuming a logic 1 at its Q terminal in response to the logic 1 of the input pulse applied through the terminal 8. The logic 1 state of the flip-flop 16 causes the second group of flip-flops 2(1)–2(4) to be preset, and simultaneously causing the RS flip-flop 20 to be reset. Thus, one counting cycle is completed. Since the flip-flop 20 is not reset until the D type flip-flop 16 assumes a logic 1, it holds the logic 1 for a considerable time interval. Therefore, the first group of flip-flops 2(5)–2(N) need no longer be manufactured so as to meet the narrow preset pulse width as previously referred to in connection with FIG. 1. This means that the flip-flops 2(5)–2(N), provided for indicating upper bits, can be reduced in size by being constructed of MOS FETs. Whilst, since the flip-flops 2(1)–2(4) are of high response type, they can be reliably preset even if the preset pulse has a narrow width.

It should be noted that the number of flip-flops connected to the NOR gate 14 is not restricted to 4, but can be varied considering the actual response characteristics of the flip-flops, manufacturing process and cost, etc.

Furthermore, the logical elements employed are not limited to those described in connection with the preferred embodiment and are capable of being replaced by equivalent elements. For example, the NOR gate 18 can be replaced by a combination of an AND gate and a plurality of inverters, wherein the inputs of the AND gate are coupled through the inverters to the Q terminals of the flip-flops 2(5)–2(N), respectively. Likewise, the NOR gate 14 can be replaced by an AND gate, in the case of which one input of the AND gate is directly coupled to the $\overline{Q}$ terminal of the RS flip-flop 20 and the another input thereof being directly to the $\overline{Q}$ terminal of the flip-flop 2(2).

Figure 2:
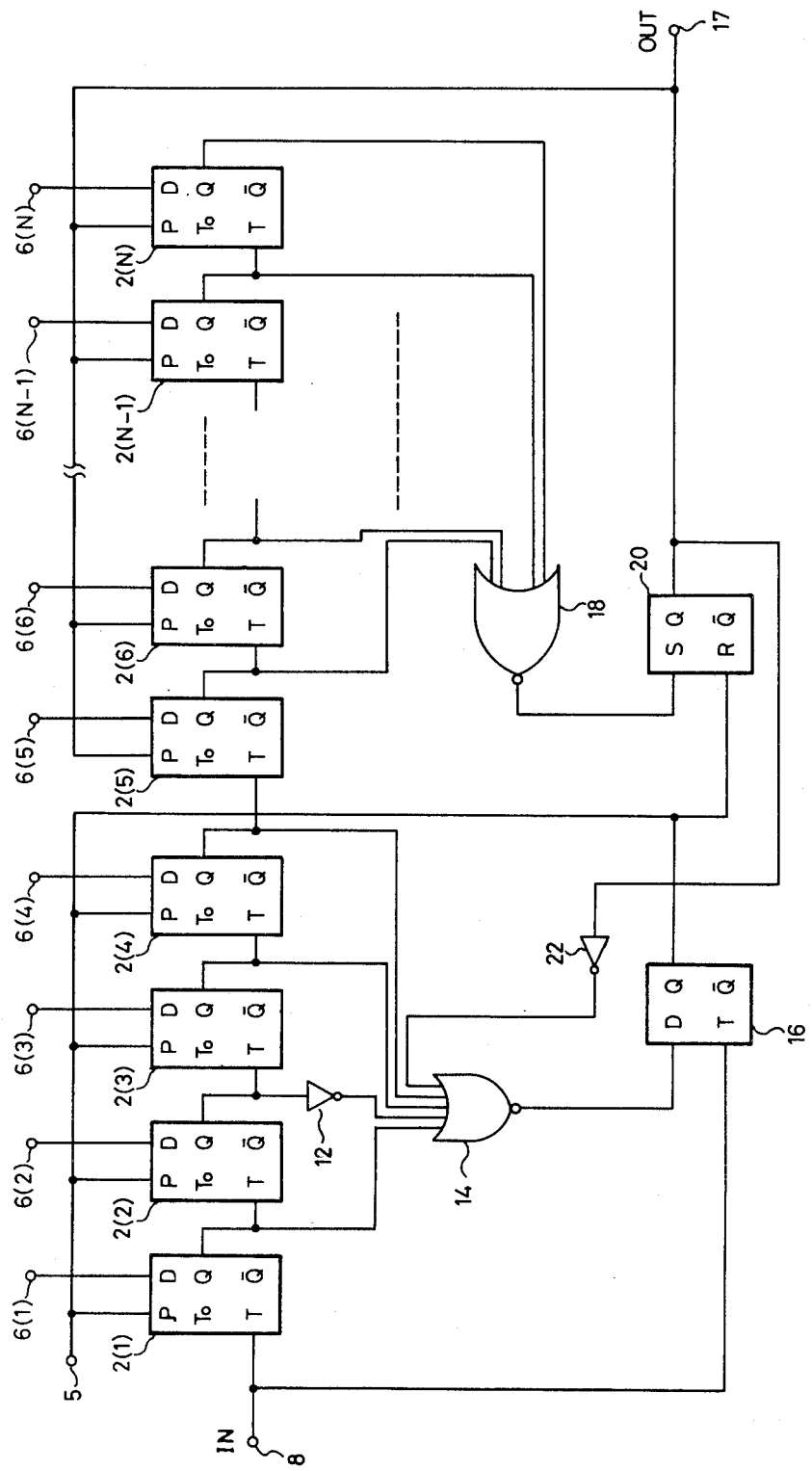
FIG. 2 is a circuit diagram showing a programmable, asynchronous binary down counter embodying this invention.

The output of the counter of FIG. 2 is derived as referred to in connection with the conventional counter of FIG. 1.

While this invention has been described in terms of a specific illustrative embodiment, it is clear to those skilled in the art to which it relates that the embodiment is susceptible of a wide range of modification within the spirit and scope of the appended claims.

What is claimed is:

1. A programmable binary down counter comprising:
   an input terminal supplied with input pulses to be counted;
   a plurality of presettable flip-flops coupled in cascade and divided into first and second groups;
   first means for detecting all the flip-flops of said first group in logic 0;
   second means for presetting all the flip-flops of said first group in response to said detection by said first means;
   third means for detecting the detection by said first means as well as a predetermined logic state of said second group, said predetermined logic state corresponding to a decimal digit 2; and
   fourth means for presetting all the flip-flops of said second group and resetting said second means, in response to said detection by said third means and to the input pulse.

2. A programmable binary down counter as claimed in claim 1, wherein said first means is a NOR gate the input of which are coupled to the flip-flops of said first group and the output of which is coupled to said second means.

3. A programmable binary down counter as claimed in claim 1, wherein said first means takes the form of a plurality of inverters and an AND gate, the inputs of said AND gate being respectively coupled through said plurality of inverters to the flip-flops of said first group and the output of said AND gate being coupled to said second means.

4. A programmable binary down counter as claimed in claim 1, wherein said second means is a RS flip-flop the set and reset terminals of which are respectively coupled to said first and fourth means, and the output of which is coupled to all the flip-flops of said first group for presetting them and coupled to said third means.

5. A programmable binary down counter as claimed in claim 1, wherein said third means is a NOR gate the inputs of which are coupled to the flip-flops of said second group and also coupled to said second means and the output of which is coupled to said fourth means.

6. A programmable binary down counter as claimed in claim 1, wherein said third means takes the form of a plurality of inverters and an AND gate, the inputs of said AND gate being respectively coupled through said inverters to the flip-flops of said second group and the output of said AND gate being coupled to said fourth means.

7. A programmable binary down counter as claimed in claim 1, wherein said fourth means is a D type flip-flop the data and clock inputs of which are respectively coupled to said third means and said input terminal, and the output of which is coupled to all the flip-flops of said second group for presetting them and coupled to said second means for resetting it.

* * * * *